United States Patent [19]

McKoy et al.

[11] Patent Number: 5,141,990
[45] Date of Patent: Aug. 25, 1992

[54] PHOTOCURABLE ACRYLIC COMPOSITION, AND U.V. CURING WITH DEVELOPMENT OF U.V. ABSORBER

[75] Inventors: Vincent B. McKoy, Flintridge; Amitava Gupta, Pasadena, both of Calif.

[73] Assignee: California Institute of Technology, Pasadena, Calif.

[21] Appl. No.: 477,357

[22] Filed: Oct. 25, 1989

Related U.S. Application Data

[63] Continuation of Ser. No. 742,413, Jun. 7, 1985, abandoned.

[51] Int. Cl.$^5$ .................... C08F 2/50; C08F 226/06
[52] U.S. Cl. ............................. 522/4; 522/14; 522/16; 522/25; 522/31; 522/75; 522/152; 522/167; 522/907; 524/91; 524/720; 526/259
[58] Field of Search ..................... 522/75, 907, 4

[56] References Cited

U.S. PATENT DOCUMENTS

| | | | |
|---|---|---|---|
| 3,629,191 | 12/1971 | Heller | 524/91 |
| 4,260,768 | 4/1981 | Lorenz | 526/259 |
| 4,328,346 | 5/1982 | Chung | 522/907 |
| 4,344,830 | 8/1982 | Olson | 522/907 |
| 4,374,955 | 2/1983 | Gupta | 522/75 |
| 4,508,882 | 4/1985 | Yoshida | 526/259 |
| 4,523,008 | 6/1985 | Vogl | 525/26 |

Primary Examiner—Marion McCamish
Assistant Examiner—Arthur H. Koeckert
Attorney, Agent, or Firm—Marvin E. Jacobs

[57] ABSTRACT

In-situ development of an ultraviolet absorber is provided by a compound such as a hydroxy-phenyl-triazole containing a group which protects the absorber during actinically activated polymerization by light at first frequency. After polymerization the protective group is removed by actinic reaction at a second frequency lower than the first frequency. The protective group is formed by replacing the hydrogen of the hydroxyl group with an acyl group containing 1 to 3 carbon atoms or an acryloxy group of the formula:

$$-O-\overset{\overset{\displaystyle O}{\|}}{C}-R^1-$$

where $R^1$ is either an alkyl containing 1 to 6 carbon atoms or $-CH=CH_2$.

10 Claims, 2 Drawing Sheets

PHOTOCURABLE ACRYLIC COMPOSITION, AND U.V. CURING WITH DEVELOPMENT OF U.V. ABSORBER

ORIGIN OF THE INVENTION

This invention was made in performance of work under Contract No. DE-AC03-83FS11944 from the U.S. Department of Energy.

This is a continuation of application Ser. No. 742,413 field Jun. 7, 1985, now abandoned.

BACKGROUND OF THE INVENTION

The present invention relates to photocurable coating formulations and, more particularly, the invention relates to a precursor material that can be converted in situ after polymerization to a U.V. absorber.

Photocuring is convenient, rapid and easily automated. It is the method of choice in applications where uniformity of the coating is critical. The development of solar thermal technology is mainly limited by the cost of high performance polymeric reflectors and enclosures for heliostats. Photocuring or photopolymerization constitutes an attractive, low cost energy-conserving process which combines the operations of generation of the polymer and forming the polymer into components.

Photocuring consumes little energy since it is a low temperature, ambient process. It also produces a superior quality, very high molecular weight polymer since thermally activated branching mechanisms are reduced to a minimum. Laminates can be built up with successively applied photocured layers. This obviates the need for adhesive or primer layers. Thin layers are formed in seconds or fractions of a second. There are a wide variety of photocurable vinyl monomers, particularly acrylics, with a wide variety of properties that can be combined by means of copolymers or laminates. For example, the excellent weatherability of acrylics can be combined with the fracture toughness of certain acrylates. Indeed, acrylics could be combined with intermediate layers of cross-linked elastomers for maximizing tear strength while retaining surface hardness, gloss and soil resistance. Certain fluoracrylates are known to be hard, antisoiling and antireflective. They have higher specular transmission than a commonly used fluoropolymer for solar thermal applications, because fluoroacrylates can be completely amorphous and have no scattering centers.

However, many of the substrates coated with the curable coatings and sometimes the coatings themselves are sensitive to ultraviolet radiation and will degrade unless the coating contains ultraviolet absorbers. Currently available photocuring technology has a major limitation since the U.V. absorbers which are incorporated into the coating to protect the substrate or to stabilize the coating compete for the incident actinic radiation, thus inhibiting the photocuring process which can increase the energy demand of the curing source or provide too slow a curing rate and/or incomplete cure.

DESCRIPTION OF THE PRIOR ART

Ultraviolet absorbers can be hydroxy-phenyl compounds such as a benzophenone or a benzotriazole. Small amounts of from 0.1 to 5 percent of the chromophore in thin film of 0.01 to 0.5 cm thickness can achieve 99 percent attenuation of ultraviolet radiation. The absorbers can be dispersed in the film or interpolymerized with the vinyl monomers. Dispersed additives are not weather stable. When a film containing the additive is exposed for long periods of time to the environment, the additives migrate to the surface and vaporize. Polymerizable absorbers are preferred since the chromophores are chemically bound to the polymer and cannot be removed from the film by the physical processes of leaching or migration. Examples of copolymerizable ultraviolet absorbers are disclosed in U.S. Pat. Nos. 4,310,650 and 4,263,366. As previously discussed, the copolymerizable absorbers compete with the photocuring catalyst for the incident ultraviolet light causing inefficient photopolymerization.

STATEMENT OF INVENTION

A photocuring formulation has been developed in the present invention which permits efficient photopolymerization to occur. The invention extends photocuring technology to ultraviolet absorbing coatings, an area in which the photopolymerization was so inefficient that it was not practical. The formulations of the invention include precursor compounds that have protective groups on the chromophore which prevent absorption of ultraviolet radiation. However, the protective groups are capable of being degraded by shorter wavelength radiation in a postpolymerization step to regenerate the absorber.

The formulations of the invention can be applied as a thin film to protect substrates that are photodegraded by ground level solar radiation such as the enclosures and reflectors for solar thermal systems, photovoltaic solar cells, optical fibers, fabrics, architectural panels and the like. The precursor compounds can be compounded into paints or lacquers for automobiles, airplanes or boats. Curable films can be deposited on the surface of substrates by extrusion, spraying, solvent casting or lamination of preformed sheets.

These and other features and attendant advantages of the invention will become apparent as the invention becomes better understood by reference to the following detailed description and the accompanying drawings.

DESCRIPTION OF THE INVENTION

Figure 1:
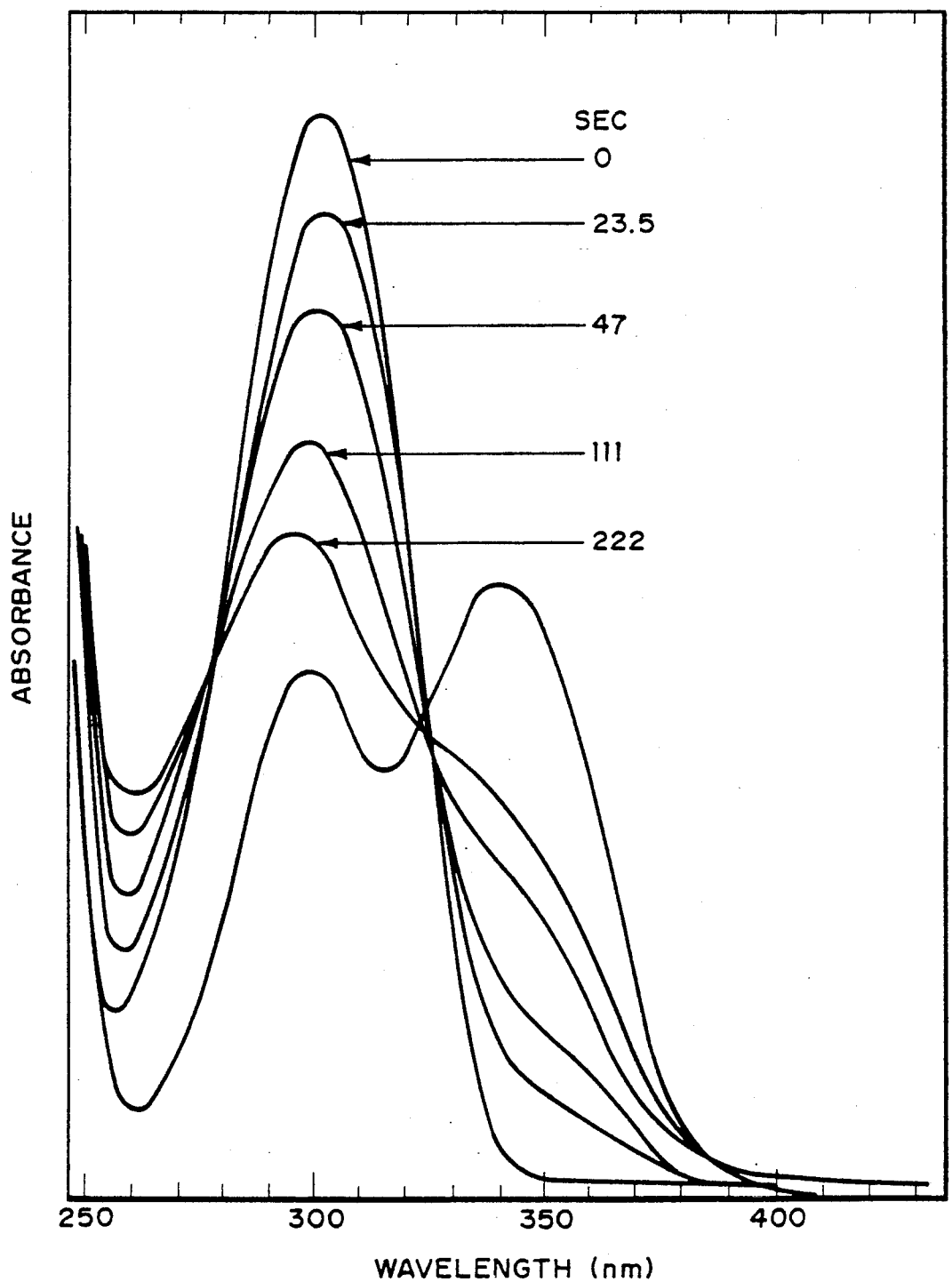
FIG. 1 is a set of U.V.-visible electronic spectra of PMMA films containing an ultraviolet absorber precursor in accordance with this invention as a function of irradiation period.

The invention is directed generally to the modification of an ultraviolet absorber to protect the U.V. chromophore during the polymerization with a protective group that can be actinically removed after polymerization. The invention will be illustrated with the class of U.V. absorbers known as hydroxy-phenyl triazoles and particularly hydroxy-phenyl benzo-triazoles:

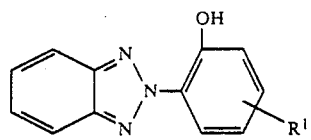

The protective group is formed by replacing the hydrogen of the hydroxyl group with an acyl group of 1 to 3 carbon atoms or an acryloxy group. $R^1$ is either an alkyl group containing 1 to 6 carbon atoms or an alkenyl group of 2 to 5 carbon atoms such as $-CH=CH_2$. The modification is conducted by use of standard reagents to convert an aromatic hydroxyl to an acyl ester such as acetyl chloride and by standard acrylating reagents such as acryloyl chloride.

The non-polymerizable precursor is present in the formulation in an amount from 0.01 to 5 percent by weight based on resin and the polymerizable precursor need only be present in amounts from 0.05 to 1.0 percent by weight, usually from 0.1 to 0.5 percent by weight. The modified absorbers of the invention show little or no absorption in the 340-400 nm U.V. range and particularly in the 360 to 380 nm band but absorb radiation in the 270 to 380 nm band and particularly the 290 to 320 band to remove the protective group and regenerate the U.V. absorbing 2-hydroxyphenyl chromophore.

The non-polymerizable precursor can be compounded with numerous polymers that degrade by absorption of U.V. radiation, particularly vinyl polymers from monomers such as acrylic acid, methacrylic acid or their esters, vinyl acetate, vinyl alcohol, ethylene, propylene, butene, styrene and the like. The precursor can also be compounded with ultraviolet sensitive epoxies, polyesters or polyurethanes.

The polymerizable precursor can be compounded with any ultraviolet radiation polymerizable monomer such as the monomers discussed above and particularly the methacrylate esters.

Experiments were conducted using 2-hydroxy-phenyl 2H-benzotriazole as the standard U.V. absorbing nucleus. The 2-hydroxy 5-methyl phenyl derivative and 2-hydroxy 5-vinyl phenyl derivatives were prepared as follows:

List of References

1. W. Pradellok, A. Gupta, O. Vogl, J. Polym Si, Polymer Chem Ed 19, 3307, (1981)

2. A. Gupta, G. W. Scott, D. Kliger and O. Vogl, in Polymers for Solar Energy Utilization, C. G. Gebelein, et al. Ed., American Chemical Society, Washington, D.C. 1983: A.C.S Symp. Ser. 220, p. 293.

3. J. V. Crivello, J. L. Lee, Macromolecules, 14, 1141 (1981).

The Methyl phenyl derivative was supplied by Ciba Geigy under trade name "Tinuvin P". It is commercially available from Ciba and American Cyanamid. The 5-vinyl phenyl derivative was synthesized according to the procedures of References 1 and 2.

EXAMPLE 1

2-Acetocy-5-methylphenyl-benzotriazole was blended in an amount of 0.1–1.5 percent by weight with polymethyl methacrylate (PMMA), poly-n-butyl acrylate, poly (2 ethyl hexyl acrylate), polymethyl acrylate and polyethyl acrylate. The blended materials were coated onto a substrate as a film having a thickness of 0.5–20 mil and the films were irradiated with light at 366 and 313 nm.

EXAMPLE 2

2-Acetoxy-5-vinylphenyl-benzotriazole was blended in an amount of 0.1–1.0 percent by weight with methacrylate esters such as methylmethacrylate, n-butylmethacrylate and ethylmethacrylate, and the photocatalyst was a mixture of diphenyl carbonyl and triethyl amine. Other photocatalysts such as aryl onium salts (benzene iodonium fluoroborate and benzene arsonium fluoroborate) were also successfully used. The monomer mixture was irradiated at 366 nm to form a polymer, P, with U.V. absorbing groups pendant from the polymer chain by irradiation at 310 nm to regenerate the 2-hydroxy group. The reaction scheme for these examples is presented below:

STEP 1

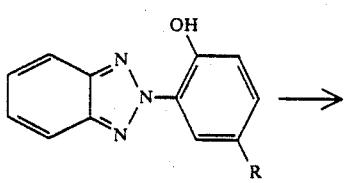

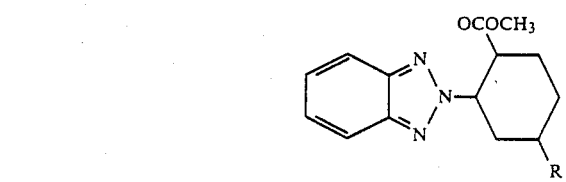

MODIFICATION OF UV ABSORBER

STEP 2

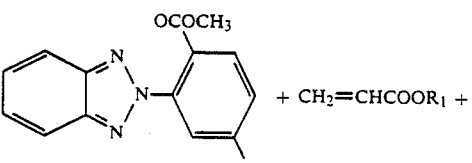

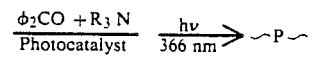

PHOTOPOLYMERIZATION

STEP 3

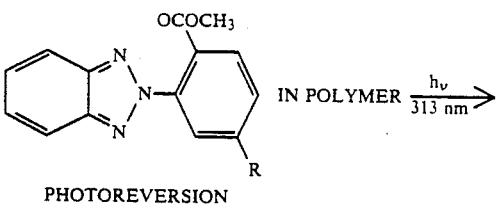

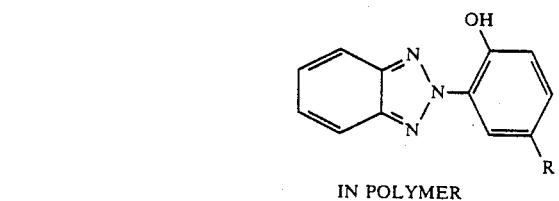

PHOTOREVERSION

IN POLYMER

The methoxy or acetoxy derivatives of Examples 1 and 2 retained the absorption band of the two original 2-hydroxy derivatives at 300 nm, but lost the absorption band at 340 nm. Photopolymerization was accomplished by using U.V. radiation at 366 nm. Subsequent to photopolymerization, the films were irradiated at 310 nm to regenerate the 2-hydroxy derivatives. The photoreversion process is most readily monitored by U.V.-visible electronic spectroscopy as shown in FIG. 1 for the PMMA film of Example 1 containing 2-acetoxy-5-methylphenyl benzotriazole. The reaction of Example 2 was repeated utilizing n-butyl acrylate, 2-ethyl hexyl acrylate and ethyl acrylate in place of the methacrylate esters.

Figure 2:
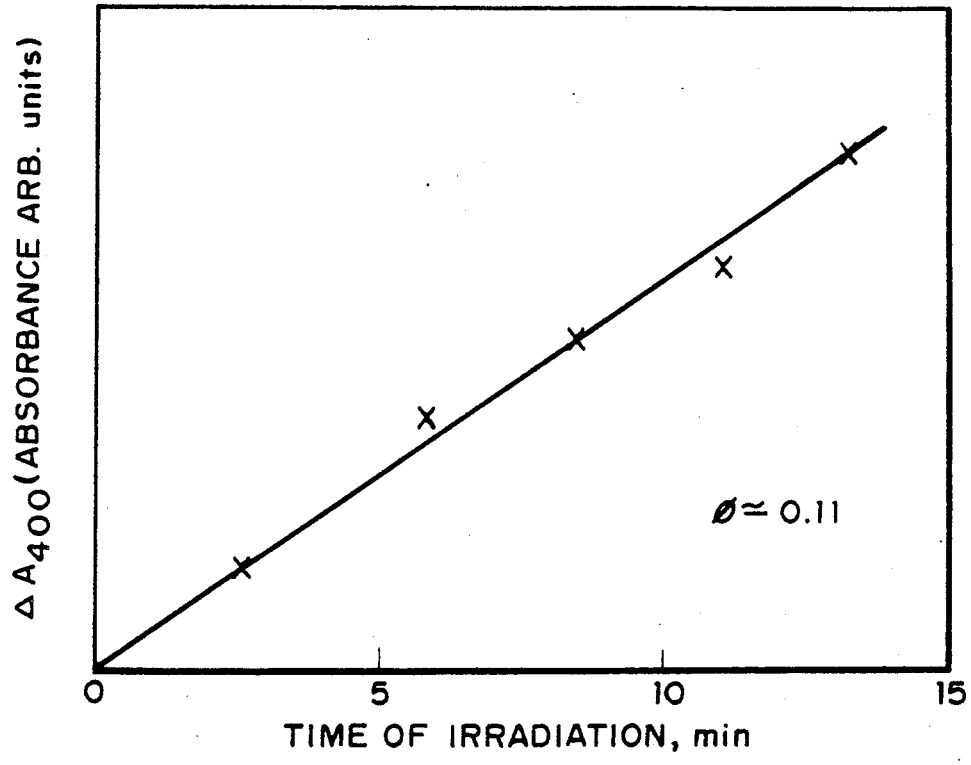
FIG. 2 is a curve showing the rate of photogeneration of the U.V. absorber in the polymer matrix.

The photopolymerization process utilizing the two step phototreatment procedure outlined above has been performed on a number of systems. High molecular weight polymer films have been obtained in every case. Table 1 gives typical characterization data. As the photoregeneration process is performed, a new absorption peak appears at 340 nm identical to what is observed in 2-hydroxy phenyl derivatives which are commonly used as U.V. absorbers. The rate of photoregeneration of the U.V. absorber is thus conveniently measured by electronic absorption measurements, as shown in FIG. 1. Quantum yields of photoconversion of the 2-methyl or 2-acetoxy derivations have been measured in fluid solution and have been found to be 0.11, as shown in FIG. 2. The same process has also been measured in solid polymer films, and has a similarly high quantum efficiency ($\sim 0.1$). Typical photoregeneration times are of the order of seconds of exposure to a filtered medium pressure mercury arc lamp.

TABLE 1

| Typical Characterization Data on Photopolymers (PMMA containing 2-hydroxy phenyl benzotriazole) Subsequent to Photoregeneration | |
|---|---|
| Property | Magnitude |
| $\underline{M}_n$ | 250,000 |
| $M_w$ | 510,000 |
| Absorption at 380 nm | >99% |
| Absorption at 500 nm | <1% |
| Specular Transmission | ~93% |
| Modulus (Tensile) | 500,000 psi |
| Monomer (Residual) | 0.2% (Wt %) |

Accelerated testing studies were performed on photocured samples. These studies involved PMMA samples containing blended-in 2-acetoxy 5-methylphenyl benzotriazole (photoreverted to the 2-hydroxy derivative), a copolymer of methyl-methacrylate (MMA) and the 2-acetoxy -vinyl derivative, and a copolymer of MMA, BA (butyl acrylate) as the polymerizable U.V. absorber group. These samples were exposed to ultraviolet radiation from a medium pressure Hg arc lamp (1 sun at airmass one overall and 6 suns airmass 1 between 240-380 nm) at 55° C. They were irradiated for 22 hours every day, and subjected to a 2 hour water spray cycle in the dark. The samples were monitored by U.V.-visible spectroscopy, FT-IR spectroscopy as well as HPLC analysis for determination of molecular weight distribution. These tests indicated that the photocured samples have equivalent or greater life expectancy than corresponding samples prepared conventionally.

The two step photocuring reaction can readily be used with other acrylic polymers, including fluoroacrylates. The process is also adaptable to provide temporary protection for other types of U.V. absorbers.

It is to be realized that only preferred embodiments of the invention have been described and that numerous substitutions, modifications and alterations are permissible without departing from the spirit and scope of the invention as defined in the following claims.

We claim:

1. A blend of monomer photopolymerizable by ultraviolet radiation at a first frequency selected from the group consisting of acrylic acid, methacrylic acid, and esters of acrylic or methacrylic acid; an amount of photoinitiator effective to polymerize said monomer at said first frequency and 0.1 to 5 percent by weight of a precursor of an ultraviolet absorber compound selected from compounds of this formula:

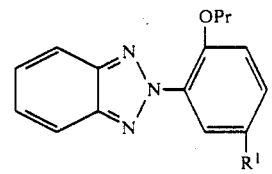

where Pr is selected from saturated acyl or acryloyl and $R^1$ is an alkenyl group of 2-5 carbon atoms.

2. A blend according to claim 1 in which $R^1$ is vinyl.
3. A blend according to claim 2 in which Pr is acetyl.
4. A blend according to claim 1 in which the monomer is methyl methacrylate.
5. A blend according to claim 2 in which the photoinitiator is an onium salt or a mixture of diphenyl carbonyl and triethylamine.
6. A method of stabilizing a polymer degradable by ultraviolet radiation and formed of a monomer polymerizable by ultraviolet radiation selected from the group consisting of acrylic acid, methacrylic acid, or esters of acrylic acid or methacrylic acid, comprising the steps of:

adding to said monomer an effective amount of a protoinitiator and 0.1 to 5 percent by weight of a precursor compound to form a blend, said precursor compound being selected from a compound of the formula:

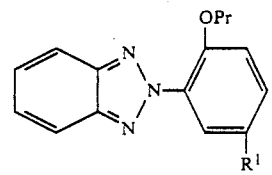

where Pr is a protective group which shows little absorption of ultraviolet energy at a first wavelength from 340 to 400 nm but is degradable by shorter wavelength ultraviolet radiation from 270 to 380 nm to convert the OPr group to a hydroxyl group, said Pr group being selected from saturated acyl or acryloyl and $R^1$ is alkenyl of 2-5 carbon atoms, irradiating the blend with ultraviolet radiation at said first wavelength to polymerize the monomer to form said polymer without removing the protective group from the precursor compound; and irradiating the blend with ultraviolet radiation at said second wavelength to convert the OPr group to a hydroxyl group whereby said hydroxyl form of the compound is capable of absorbing ultraviolet radiation at said first frequency and can protect the polymer from degradation.

7. A method according to claim 6 in which $R^1$ is vinyl.
8. A method according to claim 7 in which Pr is acetyl.
9. A method according to claim 8 in which the monomer is methyl methacrylate.
10. A method according to claim 6 in which the photoinitiator is an onium salt or a mixture of diphenyl carbonyl and triethylamine.

* * * * *